United States Patent
Liu et al.

(10) Patent No.: US 11,604,217 B2
(45) Date of Patent: Mar. 14, 2023

(54) INSULATION DETECTION CIRCUIT AND DETECTION METHOD THEREOF FOR TWO-WAY ON-BOARD CHARGER

(71) Applicant: SHENZHEN VMAX NEW ENERGY CO., LTD., Guangdong (CN)

(72) Inventors: Jun Liu, Guangdong (CN); Yingying Feng, Guangdong (CN); Jinzhu Xu, Guangdong (CN); Yuanzhao Zhang, Guangdong (CN)

(73) Assignee: SHENZHEN VMAX NEW ENERGY CO., LTD., Guangdong (CN)

( * ) Notice: Subject to any disclaimer, the term of this patent is extended or adjusted under 35 U.S.C. 154(b) by 392 days.

(21) Appl. No.: 16/857,482

(22) Filed: Apr. 24, 2020

(65) Prior Publication Data
US 2020/0249269 A1      Aug. 6, 2020

Related U.S. Application Data

(63) Continuation of application No. PCT/CN2018/115259, filed on Nov. 13, 2018.

(30) Foreign Application Priority Data

Nov. 13, 2018   (CN) .......................... 201811347609.0

(51) Int. Cl.
   *G01R 31/12*    (2020.01)
   *G01R 27/26*    (2006.01)
   *G01R 27/18*    (2006.01)

(52) U.S. Cl.
   CPC ......... *G01R 31/1272* (2013.01); *G01R 27/18* (2013.01); *G01R 27/2623* (2013.01)

(58) Field of Classification Search
   CPC ............................. G01R 31/1272; G01R 27/18; G01R 27/2623; G01R 31/14
   See application file for complete search history.

(56) References Cited

U.S. PATENT DOCUMENTS

| 2008/0084215 | A1* | 4/2008 | Itten ..................... H02H 7/1227 324/510 |
| 2011/0320056 | A1* | 12/2011 | Brown ..................... B60L 3/04 705/412 |

(Continued)

FOREIGN PATENT DOCUMENTS

| CN | 202330646 U | 7/2012 |
| CN | 103219707 A | 7/2013 |

(Continued)

OTHER PUBLICATIONS

State Intellectual Property Office of the P.R. China (ISR/CN), "International Search Report for PCT/CN2018/115259", China, dated Jul. 3, 2019.

*Primary Examiner* — Jeff W Natalini
(74) *Attorney, Agent, or Firm* — Locke Lord LLP; Tim Tingkang Xia, Esq.

(57) ABSTRACT

The present invention discloses an insulation detection circuit and a detection method thereof for a two-way on-board charger. The detection circuit comprises an inverter circuit, a first Y capacitor connected between an output live line and a ground line of the inverter circuit, a second Y capacitor connected between an output neutral line and the ground line of the inverter circuit, a live line sampling circuit and a neutral line sampling circuit which are connected with the output live line and the output neutral line of the inverter circuit, and a controller. The controller determines an insulation state of the two-way on-board charger according to two sampling voltages.

13 Claims, 7 Drawing Sheets

(56) References Cited

U.S. PATENT DOCUMENTS

| | | | |
|---|---|---|---|
| 2012/0126839 A1 | 5/2012 | Schaefer et al. | |
| 2015/0226779 A1* | 8/2015 | Carletti | G01R 23/02 |
| | | | 324/509 |
| 2015/0255976 A1* | 9/2015 | Hackl | G01R 31/42 |
| | | | 361/47 |
| 2016/0226284 A1* | 8/2016 | Spesser | H02J 7/00 |
| 2016/0315461 A1* | 10/2016 | Pieler | H02H 3/16 |
| 2018/0201142 A1* | 7/2018 | Galin | H02J 3/14 |

FOREIGN PATENT DOCUMENTS

| | | |
|---|---|---|
| CN | 203658468 U | 6/2014 |
| CN | 206583996 U | 10/2017 |
| CN | 107748292 A | 3/2018 |

\* cited by examiner

INSULATION DETECTION CIRCUIT AND DETECTION METHOD THEREOF FOR TWO-WAY ON-BOARD CHARGER

CROSS-REFERENCE TO RELATED PATENT APPLICATION

This application is a continuation application of International Patent Application No. PCT/CN2018/115259, filed on Nov. 13, 2018, which itself claims priority to Chinese Patent Application No. CN201811347609.0 filed in China on Nov. 13, 2018. The disclosures of the above applications are incorporated herein in their entireties by reference.

FIELD

The present invention relates to charging equipment, and more particularly, to an insulation detection circuit and a detection method thereof for a two-way on-board charger.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The energy crisis and environmental pollution have become increasingly serious worldwide, so the entire traditional automobile industry and the world's objective environment are facing severe challenges. With the strengthening of public environmental awareness, advocating green travel and changing the travel structure have become mainstream. With the plans of governments in developed countries to develop new energy vehicles, the Chinese government has also announced corresponding new energy vehicle development plans, and new energy vehicles have also been included in seven major emerging strategic industries. The new energy vehicles are currently the most mainstream of electric vehicles. An on-board charger is a very important component in an electric vehicle. The quality of the on-board charger directly affects the safety and reliability of the vehicle. The insulation quality between a live line and a ground line of the on-board charger is in turn related to the performances of the whole vehicle. For example, the failure of the insulation between the live line and the ground line can easily cause damage to components and even electric shock. The previous detection means is to use instruments to detect after a power failure, which is not only tedious to operate, but also cannot be monitored in real time.

Therefore, there is an urgent need in the industry to develop an insulation detection circuit and a detection method thereof that are simple to operate and can detect insulation in real time in an inverting mode.

SUMMARY

In order to solve the problems existing in the prior art, the present invention provides an insulation detection circuit and a detection method thereof for a two-way on-board charger, which are used for detecting whether there is an insulation failure between an AC output and a vehicle body when the on-board charger operates in a pure inverting mode.

The technical solution adopted by the present invention is to design an insulation detection circuit for a two-way on-board charger, the insulation detection circuit comprising an inverter circuit, a first Y capacitor connected between an output live line and a ground line of the inverter circuit, and a second Y capacitor connected between an output neutral line and the ground line of the inverter circuit, and further comprising a live line sampling circuit and a neutral line sampling circuit correspondingly connected with the output live line and the output neutral line of the inverter circuit, and a controller connected with the live line sampling circuit and the neutral line sampling circuit, wherein the controller determines an insulation state of the two-way on-board charger according to two sampling voltages.

A summing circuit is provided among the controller, the live line sampling circuit and the neutral line sampling circuit and configured to perform summing processing on the two sampling voltages and output the summed voltage, and the summed voltage is transmitted to the controller; and the controller determines an insulation state of the two-way on-board charger according to the summed voltage.

The live line sampling circuit and the neutral line sampling circuit have the same circuit structure, and each comprises a voltage dividing circuit, a bias power source, a negative bias circuit, and an impedance matching circuit, wherein the voltage dividing circuit is connected with the output live line or the output neutral line, and configured to proportionally reduce voltages to output a divided voltage; the negative bias circuit is connected between an output terminal of the voltage dividing circuit and the bias power source and configured to bias the divided voltage; and the impedance matching circuit is connected with the output terminal of the voltage dividing circuit, and configured to perform impedance matching and output a sampling voltage.

The voltage dividing circuit in the live line sampling circuit comprises a first resistor and a sixth resistor which are connected in series between the output live line and the ground line, and a connection end of the first resistor and the sixth resistor serves as the output terminal of the voltage dividing circuit; the voltage dividing circuit in the neutral line sampling circuit comprises a second resistor and a fifth resistor which are connected in series between the output neutral line and the ground line, and a connection end of the second resistor and the fifth resistor serves as the output terminal of the voltage dividing circuit.

The negative bias circuit in the live line sampling circuit comprises a fourth resistor, one end of the fourth resistor being connected with the bias power source, and the other end of the fourth resistor being connected with the connection end of the first resistor and the sixth resistor; and the negative bias circuit in the neutral line sampling circuit comprises a third resistor, one end of the third resistor being connected with the bias power source, and the other end of the third resistor being connected with the connection end of the second resistor and the fifth resistor.

The impedance matching circuit uses an emitter follower or a voltage follower.

The impedance matching circuit in the live line sampling circuit comprises a first operational amplifier, wherein a non-inverting input terminal of the first operational amplifier is connected with the connection end of the first resistor and the sixth resistor, and an output terminal of the first operational amplifier is connected with its inverting input terminal and outputs the sampling voltage; the impedance matching circuit in the neutral line sampling circuit comprises a second operational amplifier, wherein a non-inverting input terminal of the second operational amplifier is connected with the connection end of the second resistor and the fifth resistor, and an output terminal of the second operational amplifier is connected with its inverting input terminal and outputs the sampling voltage.

The summing circuit comprises a seventh resistor, an eighth resistor, a ninth resistor, and an output terminal A; the seventh resistor is connected in series between the output terminal A and an output terminal of the first operational amplifier; an eighth resistor is connected in series between the output terminal A and an output terminal of the second operational amplifier; the ninth resistor is connected in series between the output terminal A and the ground line; and the output terminal A outputs the summed voltage.

The present invention further discloses a detection method for an insulation detection circuit for a two-way on-board charger, the detection method comprising the following steps: sampling voltages on an output live line and an output neutral line of the inverter circuit respectively to obtain a sampling voltage; and determining an insulation state of the two-way on-board charger according to two sampling voltages.

In an embodiment, the detection method specifically comprises the following steps: reducing the voltages on the output live line and on the output neutral line of the inverter circuit proportionally by using a voltage dividing circuit respectively to generate a divided voltage; performing bias processing on the divided voltage by using the negative bias circuit, performing impedance matching on the divided voltage subjected to bias processing, and outputting a sampling voltage; performing summing processing on the sampling voltage of the output live line and the sampling voltage of the output neutral line by using a summing circuit, and outputting the summed voltage; and determining an insulation state of the two-way on-board charger according to the summed voltage.

According to the present invention, when the on-board charger operates in an inverting mode, the insulation impedance of the output live line L and the output neutral line N to the ground is detected, and whether there is insulation failure between the AC output in the pure inversion mode and the vehicle body is determined, thereby eliminating the hidden danger of electric shock to personnel. Meanwhile, the present invention has the advantages of simple and practical structure, easy implementation and low cost.

DETAILED DESCRIPTION

In order to make the objectives, technical solutions, and advantages of the present invention clearer, the present invention is further described in detail below with reference to the accompanying drawings and embodiments. It should be understood that the specific embodiments described herein are only used to explain the present invention and are not used to limit the present invention.

When the on-board charger operates in an inverting state, due to the requirements of a forward on-board charger (OBC) on the electromagnetic interference (EMI), there is a Y capacitor on each of the output line line L and the output neutral line N on an AC output port to the ground line during the inversion, and Y capacitance values of the output live line and the output neutral line to the ground are equal. In the presence of the Y capacitors, the output live line L and the output neutral line N generate a voltage to the ground, respectively, and the phases of the two voltages are staggered by 180 degrees. The amplitudes of the voltages are related to a ratio of the capacitance values of the output live line L and the output neutral line N of the capacitor. When the insulation of the output live line L or the output neutral line N to the ground fails, the voltage of the output live line L or the output neutral line N to the ground will lose balance.

The present invention discloses an insulation detection circuit and a detection method thereof for a two-way on-board charger. According to this method, in an inversion mode, the insulation impedances of the output live line L and the output neutral line N to the ground are obtained by detecting the voltages of the output live line L and the output neutral line N to the ground. Whether there is an insulation failure between AC output and the vehicle body when the on-board charger operates in a pure inversion mode is detected by using the insulation impedance, thereby eliminating the hidden danger of electric shock to personnel.

The insulation detection circuit for the two-way on-board charger disclosed by the present invention comprises an inverter circuit, a first Y capacitor C1 connected between an output live line and a ground line of the inverter circuit, a second Y capacitor C2 connected between an output neutral line and the ground line of the inverter circuit, a live line sampling circuit and a neutral line sampling circuit which are correspondingly connected with the output live line and the output neutral line of the inverter circuit, and a controller connected with the live line sampling circuit and the neutral line sampling circuit. The live line sampling circuit and the neutral line sampling circuit output a sampling voltage, respectively. The controller determines an insulation state of the two-way on-board charger according to the two sampling voltages.

Figure 1:
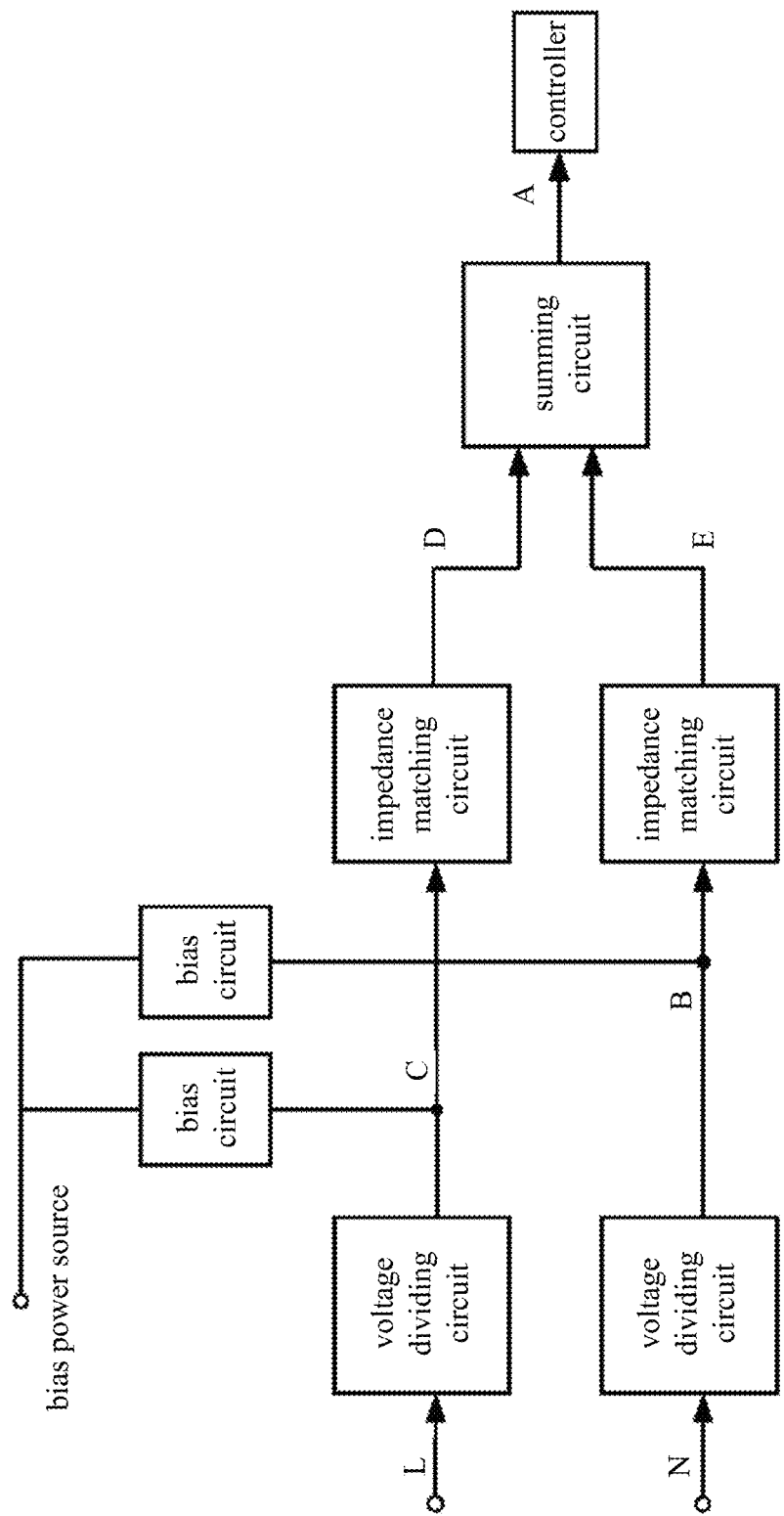
FIG. 1 is a principle block diagram of a preferred embodiment of the present invention.
Figure 2:
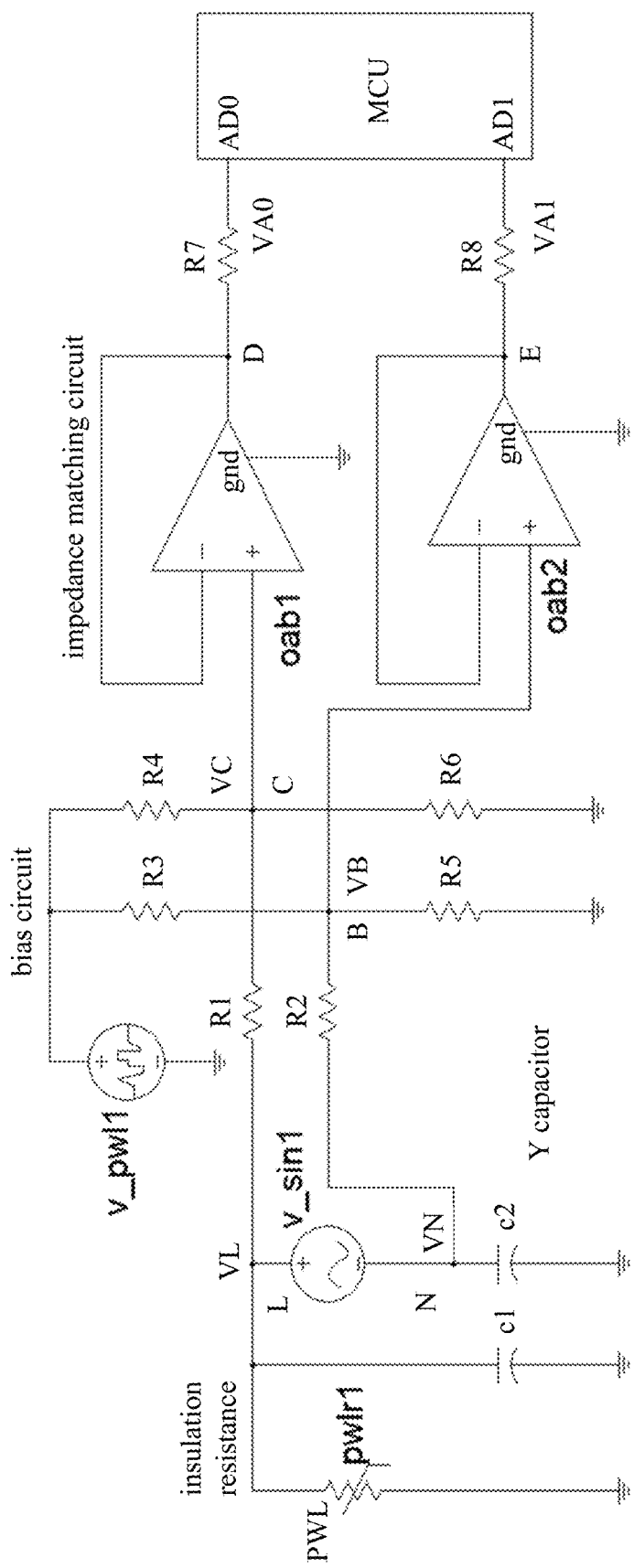
FIG. 2 is a circuit diagram without a summing circuit.

FIG. 1 is a principle block diagram of a preferred embodiment. A summing circuit is provided among the controller, the live line sampling circuit and the neutral line sampling circuit. The summing circuit is configured to perform summing processing on the two sampling voltages to obtain the summed voltage, and transmit the summed voltage to the controller. The controller determines an insulation state of the two-way on-board charger according to the summed voltage. It should be noted that the summing processing can be calculated inside the controller, and a circuit diagram of its embodiment is shown in FIG. 2. The summing processing may also be performed outside the controller. After the processing is completed, the summed voltage is transmitted to the controller, and a circuit diagram of its embodiment is shown in FIG. 3.

In the above embodiments, the live line sampling circuit and the neutral line sampling circuit have the same circuit structure, and each comprises a voltage dividing circuit, a bias power source, a negative bias circuit, and an impedance matching circuit. The voltage dividing circuit is connected with the output live line or the output neutral line, and configured to proportionally reduce voltages and output a divided voltage; The negative bias circuit is connected between an output terminal of the voltage dividing circuit and the bias power source and configured to bias the divided voltage. The impedance matching circuit is connected with the output terminal of the voltage dividing circuit, and configured to perform impedance matching and output a sampling voltage. It should be noted that the impedance matching circuit can match the impedances of an input terminal and an output terminal, so that the input impedance is high and the output impedance is low, thereby enhancing the load capacity.

Figure 3:
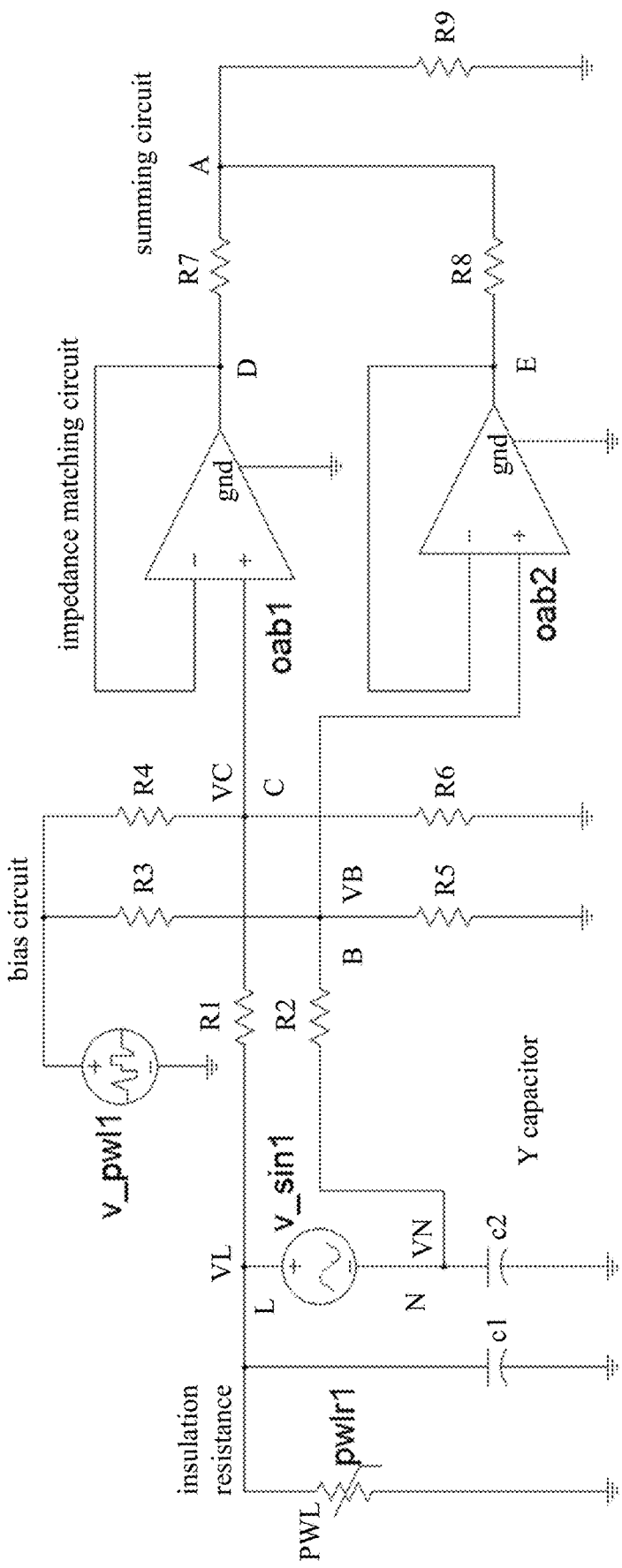
FIG. 3 is a circuit diagram with a summing circuit.

Referring to the embodiments shown in FIG. 2 and FIG. 3, the voltage dividing circuit in the live line sampling circuit comprises a first resistor R1 and a sixth resistor R6 which are connected in series between the output live line and the ground line, and a connecting end G of the first resistor and the sixth resistor serves as the output terminal of the voltage dividing circuit. The voltage dividing circuit in the neutral line sampling circuit comprises a second resistor R2 and a fifth resistor R5 which are connected in series between the output neutral line and the ground line, and a connection end B of the second resistor and the fifth resistor serves as the output terminal of the voltage dividing circuit. A voltage division ratio is determined by a ratio of values of the first resistor R1 to the sixth resistor R6, and a ratio of values of the second resistor R2 to the fifth resistor R5. In this embodiment, R1=R2, R5=R6.

The negative bias circuit in the live line sampling circuit comprises a fourth resistor R4, wherein one end of the fourth resistor is connected with the bias power source, and the other end of the fourth resistor is connected with the connection end C of the first resistor and the sixth resistor. The negative bias circuit in the neutral line sampling circuit comprises a third resistor R3, wherein one end of the third resistor is connected with the bias power source, and the other end of the third resistor is connected with the connection end B of the second resistor and the fifth resistor. In this embodiment, R3=R4.

In this embodiment, the impedance matching circuit uses an emitter follower or a voltage follower.

The impedance matching circuit in the live line sampling circuit comprises a first operational amplifier oab1. A non-inverting input terminal of the first operational amplifier is connected with the connection end C of the first resistor and the sixth resistor. An output terminal of the first operational amplifier is connected with its inverting input terminal and outputs the sampling voltage. The impedance matching circuit in the neutral line sampling circuit comprises a second operational amplifier oab2. A non-inverting input terminal of the second operational amplifier is connected with the connection end B of the second resistor and the fifth resistor. An output terminal of the second operational amplifier is connected with its inverting input terminal and outputs the sampling voltage.

In this embodiment as shown in FIG. 3, the summing circuit comprises a seventh resistor R7, an eighth resistor R8, a ninth resistor R9, and an output terminal A. The seventh resistor R7 is connected in series between the output terminal A and the output terminal of the first operational amplifier. The eighth resistor R8 is connected in series between the output terminal A and the output terminal of the second operational amplifier. The ninth resistor R9 is connected in series between the output terminal A and the ground line. The output terminal A outputs the summed voltage to the controller.

The working principle of the present invention is described in detail below with reference to FIG. 3. There are Y capacitors for the output live line L and the output neutral line N of the converter circuit of the charger, that is, the first Y capacitor C1 and the second Y capacitor C2, where C1=C2. The Y capacitors causes the output live line L and the output neutral line N to generate voltages VL and VN to the ground, respectively. In addition, phases of these two voltages differ by 180 degrees. The amplitudes of these two voltages are related to the ratio of the Y capacitors, in which:

$$VL = Vac \cdot \sqrt{2} \cdot \sin(2 \cdot \pi \cdot f \cdot t + \pi] \cdot \frac{C1}{C1+C2} \quad \text{(Formula 1)}$$

$$VN = Vac \cdot \sqrt{2} \cdot \sin(2 \cdot \pi \cdot f \cdot t) \cdot \frac{C2}{C1+C2} \quad \text{(Formula 2)}$$

In the formulas, f is the frequency of an AC voltage, and t is a time.

The resistors R2 and R5 are connected between the output neutral line N and the ground line. The voltage on the output neutral line N is proportionally reduced. A voltage VB1 is formed at a point B of the connection end of R2 and R5. A resistor R3 is added between the bias power source v_pwl1 and the point B, and v_pwl1 and R3 and R5 form a DC bias voltage VB2 to a point C. The voltage VB at the point B is a sum of VB1 and VB2.

In which, $$VB1 = VN * R5/(R2+R5) \quad \text{(Formula 3)}$$

$$VB2 = v\_pwl1 * R5/(R3+R5) \quad \text{(Formula 4)}$$

$$VB = VB1 + VB2 \quad \text{(Formula 5)}$$

The resistors R1 and R6 are connected between the output live line L and the ground line. The voltage on the output live line L is proportionally reduced. A voltage VC1 is formed at the point C of the connection end of R1 and R6. A resistor R4 is added between the bias power source v_pwl1 and the point C, and v_pwl1 and R5 and R6 form a DC bias voltage VC2 to the point C. The voltage VC at the point C is a sum of VC1 and VC2.

$$VC1 = VL * R6/(R1+R6) \quad \text{(Formula 6)}$$

$$VC2 = v\_pwl1 * R6/(R4+R6) \quad \text{(Formula 7)}$$

$$VC = VC1 + VC2 \quad \text{(Formula 8)}$$

After the voltage at the point C passes through the impedance matching circuit, the voltage VD at a point D of an output terminal D of the first operational amplifier is equal to VC. In the same way, after the voltage at the point B passes through the impedance matching circuit, the voltage VE at a point E of an output terminal E of the second operational amplifier is equal to VB. The voltages at the points D and E are added to the point A via the resistors R7 and R8. The voltage at the point A is:

$$VA = VD + VE \quad \text{(Formula 9)}$$

VA is obtained in combination with Formulas 1 to 9.

$$VA = \quad \text{(Formula 10)}$$

$$\frac{(Vac \cdot \sqrt{2} \cdot \sin(2 \cdot \pi f \cdot t)) \cdot \left[\frac{-C1}{C1+C2} \cdot R5 \cdot (R1+R6) + \frac{C2}{C1+C2} \cdot R6 \cdot (R2+R5)\right]}{(R2+R5) \cdot (R1+R6)} +$$

$$V\_PWL1 \cdot \frac{R6}{R4+R6} + V\_PWL1 \cdot \left(\frac{R5}{R3+R5}\right)$$

The voltage at the point A in FIG. 3 is sent to an AD sampling port of the controller MCU. In a normal state, the impedances of the output live line L and the output neutral line N to the ground are infinite, that is, pwlr1 is infinite in FIG. 3. In addition, the value of the Y capacitor C1 of the output live line L to the ground is equal to the value of the Y capacitor C2 of the output neutral line N to the ground. In a normal insulation state, a divided voltage VB1 of the output live line L to the ground line and a divided voltage VC1 of the output neutral line N to the ground line add up to zero, which is as shown in the following formula;

$$VB1 + VC1 = \frac{(Vac \cdot \sqrt{2} \cdot \sin(2 \cdot \pi f \cdot t)) \cdot \left[\frac{-C1}{C1+C2} \cdot R5 \cdot (R1+R6) + \frac{C2}{C1+C2} \cdot R6 \cdot (R2+R5)\right]}{(R2+R5) \cdot (R1+R6)}$$

A sum of the voltages at the point A is equal to a sum of negative bias voltages. That is, in the normal insulation state, $$VA = V\_PWL1 \cdot \frac{R6}{R4+R6} + V\_PWL1 \cdot \left(\frac{R5}{R3+R5}\right)$$

Figure 4:
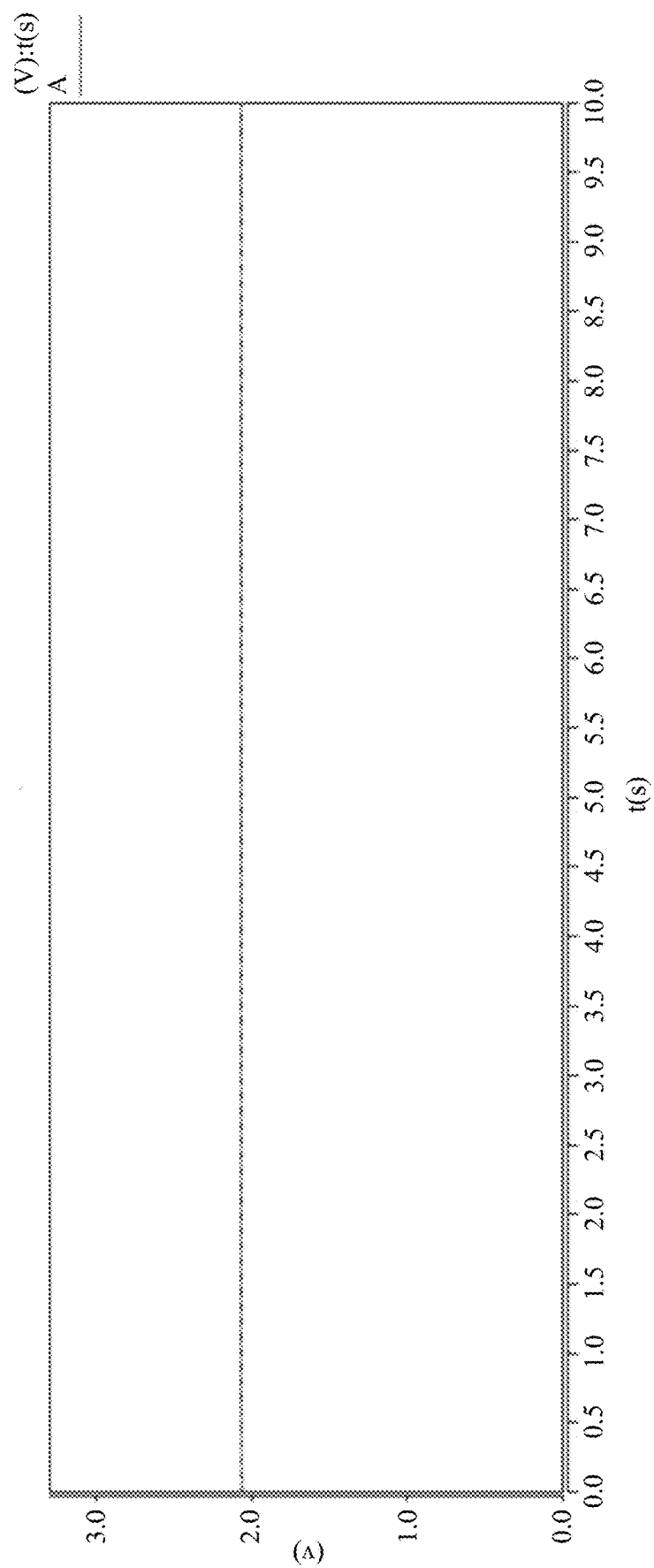
FIG. 4 is a waveform diagram of a summed voltage when the insulation is normal.
Figure 6:
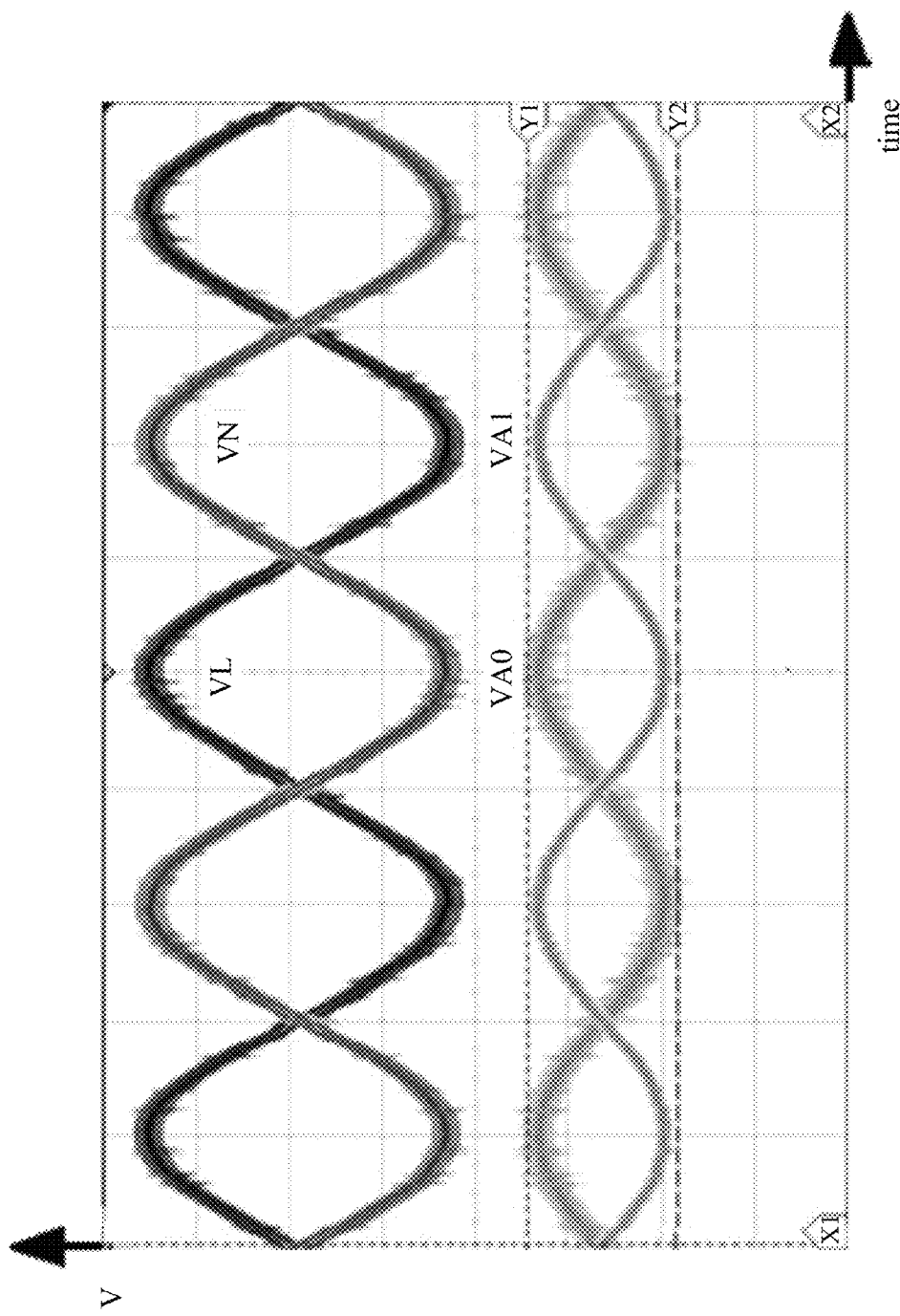
FIG. 6 is a waveform diagram of a voltage at each point when the insulation is normal.

The controller MCU reads a voltage value at the point A through AD sampling. The voltage value at the point A is equal to a sum of negative bias voltage values of the output live line L and the output neutral line N (the voltage at the point A is shown in FIG. 4). The summed voltage remains constant in amplitude, and the graph shows a straight line. In this case, the controller MCU determines whether the output live line L and the output neutral line N are normally insulated. In the normal state, the insulation resistance pwlr1 is considered to be infinite, and the insulation resistance pwlr1 is ignored in the above formula. FIG. 6 shows voltage waveforms at various points when the insulation is normal. VL is a voltage of the output live line L to the ground, VN is a voltage of the output neutral line N to the ground, VA0 is a voltage at an output terminal of R7, and VA1 is a voltage at an output terminal of R8.

Figure 5:
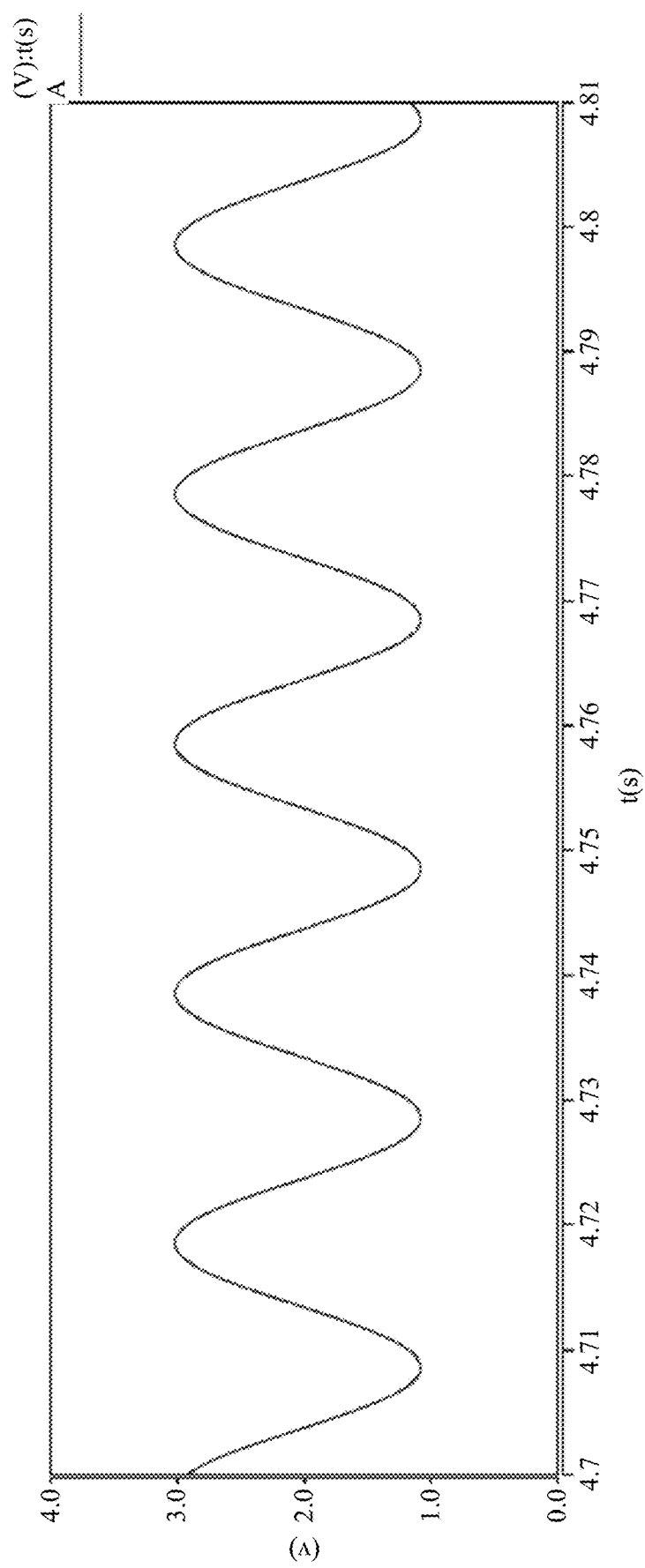
FIG. 5 is a waveform diagram of a summed voltage when the insulation fails.
Figure 7:
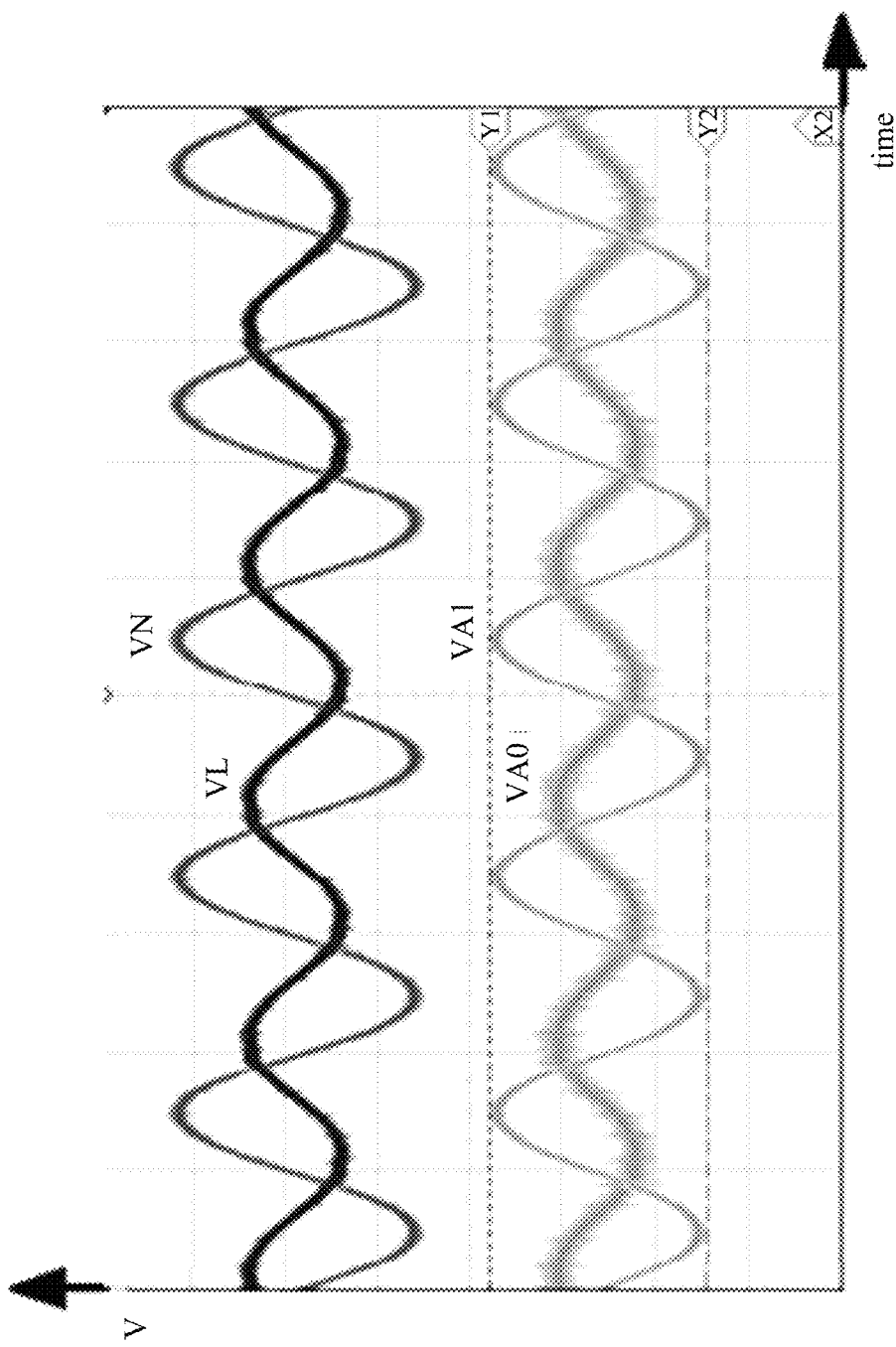
FIG. 7 is a waveform diagram of a voltage at each point when the insulation fails.

When the output live line L or the output neutral line N has an insulation failure to the ground line, the impedance of the output live line L or the output neutral line N to the ground line is decreasing. That is, PWLr1 in FIG. 2 or FIG. 3 decreases from infinity, and the impedance of the output live line L to the ground will decrease. In this case, the voltage of VL to the ground line and the voltage of VN to the ground line will lose balance, and the sum of VN and VL is no longer equal to zero. According to the actual measurement shown in FIG. 5, the amplitude of the summed voltage shows a sine wave waveform. The controller MCU will determine that the insulation fails according to the voltage value obtained by AD sampling, and meanwhile determine the amplitude of the value of the insulation resistance. FIG. 7 shows voltage waveforms at various points when the insulation fails. VL is a voltage of the output live line L to the ground, VN is a voltage of the output neutral line N to the ground, VA0 is a voltage at the output terminal of R7, and VA1 is a voltage at the output terminal of R8.

In an embodiment as shown in FIG. 2, the controller MCU uses two different AD sampling ports to input samplings of VL and VN to the MCU, and performs summing processing.

The present invention further discloses a detection method for an insulation detection circuit for a two-way on-board charger. The detection circuit comprises an inverter circuit, a first Y capacitor C1 connected between an output live line and a ground line of the inverter circuit, and a second Y capacitor C2 connected between an output neutral line and the ground line of the inverter circuit. The detection method comprises the following steps: sampling voltages on the output live line and the output neutral line of the inverter circuit, respectively; and determining an insulation state of the two-way on-board charger according to the two sampling voltages.

In a preferred embodiment, the detection method comprises the following steps: reducing voltages on the output live line and on the output neutral line of the inverter circuit proportionally by using a voltage dividing circuit respectively to generate a divided voltage; performing bias processing on the divided voltage by using a negative bias circuit, performing impedance matching on the divided voltage subjected to bias processing, and outputting a sampling voltage; performing summing processing on the sampling voltage of the output live line and the sampling voltage of the output neutral line by using a summing circuit to obtain a summed voltage; and determining an insulation state of the two-way on-board charger according to the summed voltage.

The above embodiments are merely examples, and are not limitative. Any equivalent modifications or changes made without departing from the spirit and scope of the present application shall be included in the scope of claims of the present application.

What is claimed is:

1. An insulation detection circuit for a two-way on-board charger, comprising:
    an inverter circuit,
    a first Y capacitor connected between an output live line and a ground line of the inverter circuit, and
    a second Y capacitor connected between an output neutral line and the ground line of the inverter circuit,
    a live line sampling circuit and a neutral line sampling circuit correspondingly connected with the output live line and the output neutral line of the inverter circuit, and
    a controller connected with the live line sampling circuit and the neutral line sampling circuit, wherein the controller determines an insulation state of the two-way on-board charger according to sampling voltages respectively output by the two sampling circuits,
    wherein a summing circuit is provided among the controller, the live line sampling circuit and the neutral line sampling circuit and configured to perform summing processing on the two sampling voltages and output a summed voltage; and the controller determines an insulation state of the two-way on-board charger according to the summed voltage,
    wherein the live line sampling circuit and the neutral line sampling circuit have the same circuit structure, and each of the live line sampling circuit and the neutral line sampling circuit comprises: a voltage dividing circuit, a bias power source, a bias circuit, and an impedance matching circuit, wherein:
        the voltage dividing circuit is connected with the output live line or the output neutral line, and configured to proportionally reduce voltages to output a divided voltage;
        the bias circuit is connected between an output terminal of the voltage dividing circuit and the bias power source and configured to bias the divided voltage; and the impedance matching circuit is connected with the output terminal of the voltage dividing circuit, and configured to perform impedance matching and output one of the sampling voltages.

2. The insulation detection circuit according to claim 1, wherein the voltage dividing circuit in the live line sampling circuit comprises a first resistor R1 and a sixth resistor R6 which are connected in series between the output live line and the ground line, and a connection end of the first resistor and the sixth resistor serves as the output terminal of the voltage dividing circuit; the voltage dividing circuit in the neutral line sampling circuit comprises a second resistor R2 and a fifth resistor R5 which are connected in series between the output neutral line and the ground line, and a connection end of the second resistor and the fifth resistor serves as the output terminal of the voltage dividing circuit.

3. The insulation detection circuit according to claim 1, wherein the bias circuit in the live line sampling circuit comprises a fourth resistor R4, wherein one end of the fourth resistor is connected with the bias power source, and the other end of the fourth resistor is connected with the connection end of the first resistor and the sixth resistor; the bias circuit in the neutral line sampling circuit comprises a third resistor R3, wherein one end of the third resistor is connected with the bias power source, and the other end of the third resistor is connected with the connection end of the second resistor and the fifth resistor.

4. The insulation detection circuit according to claim 1, wherein the impedance matching circuit uses an emitter follower or a voltage follower.

5. The insulation detection circuit according to claim 4, wherein the impedance matching circuit in the live line sampling circuit comprises a first operational amplifier, wherein a non-inverting input terminal of the first operational amplifier is connected with the connection end of the first resistor and the sixth resistor, and an output terminal of the first operational amplifier is connected with its inverting input terminal and outputs the sampling voltage; the impedance matching circuit in the neutral line sampling circuit comprises a second operational amplifier, wherein a non-inverting input terminal of the second operational amplifier is connected with the connection end of the second resistor and the fifth resistor, and an output terminal of the second operational amplifier is connected with its inverting input terminal and outputs the sampling voltage.

6. The insulation detection circuit according to claim 5, wherein the summing circuit comprises a seventh resistor R7, an eighth resistor R8, a ninth resistor R9, and an output terminal A; the seventh resistor is connected in series between the output terminal A and an output terminal of the first operational amplifier; an eighth resistor is connected in series between the output terminal A and an output terminal of the second operational amplifier; the ninth resistor is connected in series between the output terminal A and the ground line; and the output terminal A outputs the summed voltage.

7. A detection method for determining an insulation state of a two-way on-board charger using the insulation detection circuit according to claim 1, the detection method comprising:
sampling voltages on the output live line and the output neutral line of the inverter circuit, respectively; and
determining the insulation state of the two-way on-board charger by the controller according to the sampling voltages output by the two sampling circuits.

8. The detection method according to claim 7, wherein the detection method specifically comprises the following steps:

reducing voltages on the output live line and on the output neutral line of the inverter circuit proportionally by using the voltage dividing circuit respectively to generate the divided voltage;
performing bias processing on the divided voltage by using the bias circuit, performing impedance matching on the divided voltage subjected to bias processing, and outputting the sampling voltages;
performing summing processing on the sampling voltage of the output live line and the sampling voltage of the output neutral line by using the summing circuit, and outputting the summed voltage; and
determining the insulation state of the two-way on-board charger according to the summed voltage.

9. An insulation detection circuit for a two-way on-board charger, comprising:
an inverter circuit;
a first Y capacitor connected between an output live line and a ground line of the inverter circuit;
a second Y capacitor connected between an output neutral line and the ground line of the inverter circuit;
a live line sampling circuit and a neutral line sampling circuit correspondingly connected with the output live line and the output neutral line of the inverter circuit; and
a controller connected with the live line sampling circuit and the neutral line sampling circuit, wherein the controller determines an insulation state of the two-way on-board charger according to sampling voltages respectively output by the two sampling circuits,
wherein the live line sampling circuit and the neutral line sampling circuit have the same circuit structure, and each of the live line sampling circuit and the neutral line sampling circuit comprises: a voltage dividing circuit, a bias power source, a bias circuit, and an impedance matching circuit, wherein:
the voltage dividing circuit is connected with the output live line or the output neutral line, and configured to proportionally reduce voltages to output a divided voltage;
the bias circuit is connected between an output terminal of the voltage dividing circuit and the bias power source and configured to bias the divided voltage; and
the impedance matching circuit is connected with the output terminal of the voltage dividing circuit, and configured to perform impedance matching and output one of the sampling voltages.

10. The insulation detection circuit according to claim 9, wherein the voltage dividing circuit in the live line sampling circuit comprises a first resistor R1 and a sixth resistor R6 which are connected in series between the output live line and the ground line, and a connection end of the first resistor and the sixth resistor serves as the output terminal of the voltage dividing circuit; the voltage dividing circuit in the neutral line sampling circuit comprises a second resistor R2 and a fifth resistor R5 which are connected in series between the output neutral line and the ground line, and a connection end of the second resistor and the fifth resistor serves as the output terminal of the voltage dividing circuit.

11. The insulation detection circuit according to claim 9, wherein the bias circuit in the live line sampling circuit comprises a fourth resistor R4, wherein one end of the fourth resistor is connected with the bias power source, and the other end of the fourth resistor is connected with the connection end of the first resistor and the sixth resistor; the bias circuit in the neutral line sampling circuit comprises a third resistor R3, wherein one end of the third resistor is connected with the bias power source, and the other end of the third resistor is connected with the connection end of the second resistor and the fifth resistor.

12. The insulation detection circuit according to claim 9, wherein the impedance matching circuit uses an emitter follower or a voltage follower.

13. The insulation detection circuit according to claim 12, wherein the impedance matching circuit in the live line sampling circuit comprises a first operational amplifier, wherein a non-inverting input terminal of the first operational amplifier is connected with the connection end of the first resistor and the sixth resistor, and an output terminal of the first operational amplifier is connected with its inverting input terminal and outputs the sampling voltage; the impedance matching circuit in the neutral line sampling circuit comprises a second operational amplifier, wherein a non-inverting input terminal of the second operational amplifier is connected with the connection end of the second resistor and the fifth resistor, and an output terminal of the second operational amplifier is connected with its inverting input terminal and outputs the sampling voltage.

\* \* \* \* \*